United States Patent
Dai et al.

(10) Patent No.: US 7,379,000 B2
(45) Date of Patent: May 27, 2008

(54) FLOATING GATE DIGITAL-TO-ANALOG CONVERTER

(75) Inventors: Rongqing Dai, Castaic, CA (US); James S. Little, Saugus, CA (US); Kea-Tiong Tang, Temple City, CA (US)

(73) Assignee: Second Sight Medical Products, Inc., Sylmar, CA (US)

( * ) Notice: Subject to any disclaimer, the term of this patent is extended or adjusted under 35 U.S.C. 154(b) by 0 days.

(21) Appl. No.: 11/786,480

(22) Filed: Apr. 12, 2007

(65) Prior Publication Data

US 2007/0194966 A1    Aug. 23, 2007

Related U.S. Application Data

(60) Continuation of application No. 11/452,022, filed on Jun. 13, 2006, now Pat. No. 7,224,301, which is a division of application No. 10/308,438, filed on Dec. 2, 2002, now Pat. No. 7,224,300.

(60) Provisional application No. 60/337,601, filed on Nov. 30, 2001.

(51) Int. Cl.
*H03M 1/00* (2006.01)
(52) U.S. Cl. .................. 341/136; 341/134; 341/143
(58) Field of Classification Search ................ 341/133, 341/136, 144–154
See application file for complete search history.

(56) References Cited

U.S. PATENT DOCUMENTS

| | | | |
|---|---|---|---|
| 4,547,762 A | 10/1985 | Ono ........................... 341/133 |
| 4,551,705 A | 11/1985 | Anderson .................... 341/136 |
| 5,109,844 A | 5/1992 | de Juan, Jr. et al. .......... 607/53 |
| 5,111,204 A | 5/1992 | Katzenstein ................. 341/150 |
| 5,140,538 A * | 8/1992 | Bass et al. ...................... 708/3 |
| 5,376,935 A * | 12/1994 | Seligson ..................... 341/136 |
| 5,568,145 A * | 10/1996 | Reynolds .................... 341/145 |
| 5,631,647 A | 5/1997 | Huang ........................ 341/136 |
| 5,703,582 A * | 12/1997 | Koyama et al. ............ 341/120 |
| 5,935,155 A | 8/1999 | Humayun et al. ............ 607/54 |
| 5,952,946 A * | 9/1999 | Kramer et al. ............. 341/136 |
| 6,037,885 A * | 3/2000 | Schmitt-Landsiedel et al. ......... 341/136 |
| 6,088,017 A * | 7/2000 | Tremblay et al. ........... 345/156 |
| 6,181,969 B1 | 1/2001 | Gord .......................... 607/59 |
| 6,191,715 B1 | 2/2001 | Fowers ....................... 341/120 |
| 6,246,351 B1 | 6/2001 | Yilmaz ....................... 341/145 |
| 6,486,806 B1 * | 11/2002 | Munoz et al. .............. 341/120 |
| 6,545,625 B2 | 4/2003 | Hottgenroth ................ 341/155 |

(Continued)

OTHER PUBLICATIONS

Figueroa, et al., "A Floating-Gate Trimmable High Resolution DAC in Standard 0.25um CMOS", Aug. 1, 2001, Nonvolatile Semiconductor Memory Workshop, Monterey, CA pp. 46-47, Retrieved from the Internet: URL: http://www.cs.washington.edu.

*Primary Examiner*—Linh V. Nguyen
(74) *Attorney, Agent, or Firm*—Scott B. Dunbar

(57) ABSTRACT

The present invention provides a DAC constructed from a series of floating gate devices which are programmable to a series of predetermined values. Addressing one or more of the programmed floating gate devices will select from a wide variety of analog outputs. Reprogramming the floating gate devices, can provide a different variety of analog outputs. For example, the floating gate devices can be preprogrammed to a different range of outputs matching a range of perceptible signals.

6 Claims, 2 Drawing Sheets

U.S. PATENT DOCUMENTS 6,567,023 B1    5/2003   Iwata ......................... 341/126
6,819,277 B1 *  11/2004  Hu et al. .................... 341/144
7,030,799 B2 *  4/2006   Lee et al. ................... 341/144
7,068,201 B1    6/2006   Chou ......................... 341/144

* cited by examiner

FLOATING GATE DIGITAL-TO-ANALOG CONVERTER

CROSS REFERENCE TO RELATED APPLICATIONS

This application is a continuation of application Ser. No. 11/452,022 filed Jun. 13, 2006, now U.S. Pat. No. 7,224,301 which is a divisional of application Ser. No. 10/308,438, filed Dec. 2, 2002, now U.S. Pat. No. 7,224,300 which claims the benefit of provisional application Ser. No. 60/337,601, filed Nov. 30, 2001, all of which are hereby incorporated by reference.

GOVERNMENT INTERESTS

This invention was made with government support under grant No. R24EY12893-01, awarded by the National Institutes of Health. The government has certain rights in the invention.

FIELD OF THE INVENTION

The present invention relates a digital-to-analog converter (DAC) and more particularly to a reduced size programmable DAC suitable for implantable medical devices.

BACKGROUND OF THE INVENTION

The medical industry has developed a wide range of uses for implantable electrical stimulators, some are well developed while some are still experimental. Uses include pacemakers, cochlear stimulators for the deaf, retinal stimulators for the blind, and muscle stimulators to cure paralysis, chronic pain, sleep apnea, reduction of spasticity in limbs and eyelid droop.

In each of these technologies, the amount of current provided to a given electrode must be externally controllable. External control is typically provided by a digital signal transmitted to the implanted device. A small efficient and flexible digital-to-analog converter (DAC) and driver are required to convert the transmitted digital signal to a current level at each stimulator electrode.

These devices very quickly become large and complex. For example, a retinal stimulator for the blind requires one electrode for each pixel of light perceived. The current on each electrode, must change dynamically, with changes in the intensity of the light signal provided to the retina. A large number of electrodes, and a large number of corresponding DACs and drivers, are required to provide even limited vision. In addition to the varying signal relative to perceived light, the perception threshold and maximum tolerable level vary from person to person. Because the perceptible range is different for each individual, a DAC with a broad enough range to work for all people, would also provide levels unusable for many or those people. As the surgery for implanting such devices is quite complex, it would be an unreasonable burden on a patient to switch out a DAC for one with a different range.

One DAC is described in U.S. Pat. No. 6,181,969, ("Gord"). Gord discloses an efficient array of DACs for a cochlear stimulator. However, the Gord device requires preset devices which, when selected, provide a predetermined current level. A finite set of current levels are available. Once a device is implanted, it is impossible to change the range of selectable outputs. By summing the output of each device, it is possible to compound the possible output currents by two (i.e. 2 devices—4 levels, 3 devices—8 levels, 4 devices—16 levels, etc.). To achieve a reasonable level of sight for most people, would require an implant so large and complex, that it could not be implanted in or near the eye.

What is needed is a simple, efficient, and flexible DAC and driver that can provided a wide range of current levels. It is also important that a large number of DACs and drivers be manufacturable in a small package at a reasonable cost.

SUMMARY OF THE INVENTION

The present invention addresses these and other short comings in the prior art by providing a DAC constructed from a series of floating gate devices. Floating gate devices are programmable to a predetermined value. Addressing one or more of the programmed floating gate devices will select from a variety of analog outputs. Reprogramming the floating gate devices, can provide a different variety of analog outputs. For example, the floating gate devices can be reprogrammed to a different range of outputs matching a range of perceptible signals.

BRIEF DESCRIPTION OF THE DRAWINGS

Preferred embodiments demonstrating the various objectives and features of the invention will now be described in conjunction with the following drawings.

DETAILED DESCRIPTION OF THE PREFERRED EMBODIMENTS OF THE INVENTION

Figure 1:
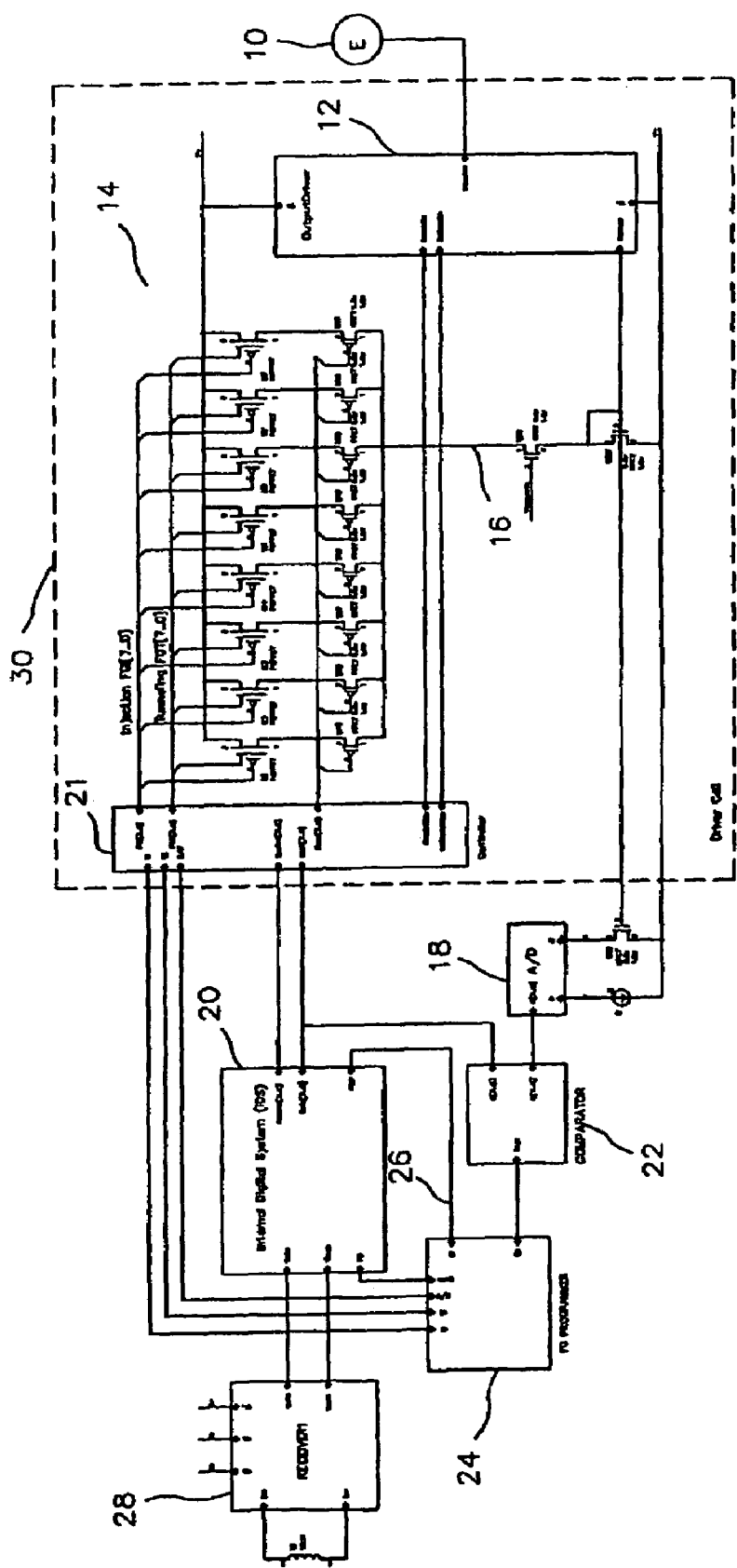
FIG. 1 is a schematic diagram of the floating gate digital to analog converter.

FIG. 1 shows the floating gate digital analog converter (DAC) of the present invention.

The DAC provides electrical current to an electrode 10, through a driver 12. A series of floating gate devices 14 provide current, via a common output 16 to the driver 12. The common output 16 is also coupled to an analog-to-digital converter (ADC) 18. The ADC 18 provides a digital measurement of the current output of the floating gate devices 14. An internal digital system 20 activates each floating gate device individually, or in combination, through a controller 21. The digital address signal from internal digital system 20 is compared with the output of the ADC 18 in a comparator 22. When a match is detected between the output of ADC 18 and the internal digital system 20, the comparator 22 signals a floating gate programming controller 24. The floating gate programming controller 24 is initialized by a program signal 26 from the internal digital system 20.

At startup the internal digital system 20 begins the programming cycle. In the preferred embodiment, the floating gate devices are programmed from a highest level device associated with a most significant bit to a lowest level device associated with a least significant bit, each device is programmed to half the value previous device. It should be noted that a significant advantage of the present invention is that floating gate values can be reprogrammed dynamically, increasing the number of available values.

The preferred neural stimulator provides a plurality of electrodes 10. Each electrode 10 must have its own driver cell 30, including a controller 21, series of floating gate devices 14, and driver 12. However, the ADC 18, the internal digital system 20, the comparator 22, and the floating gate programming controller 24 may be multiplexed across a series of driver cells 30 and electrodes 10.

During stimulation, a receiver 28 receives a signal from an external transmitter (not shown) with stimulation information. The receiver provides the stimulation information to the internal digital system 20, which then addresses the controller 21 and floating gate devices 14, resulting in the selected current being provided to the electrode 10.

Figure 2:
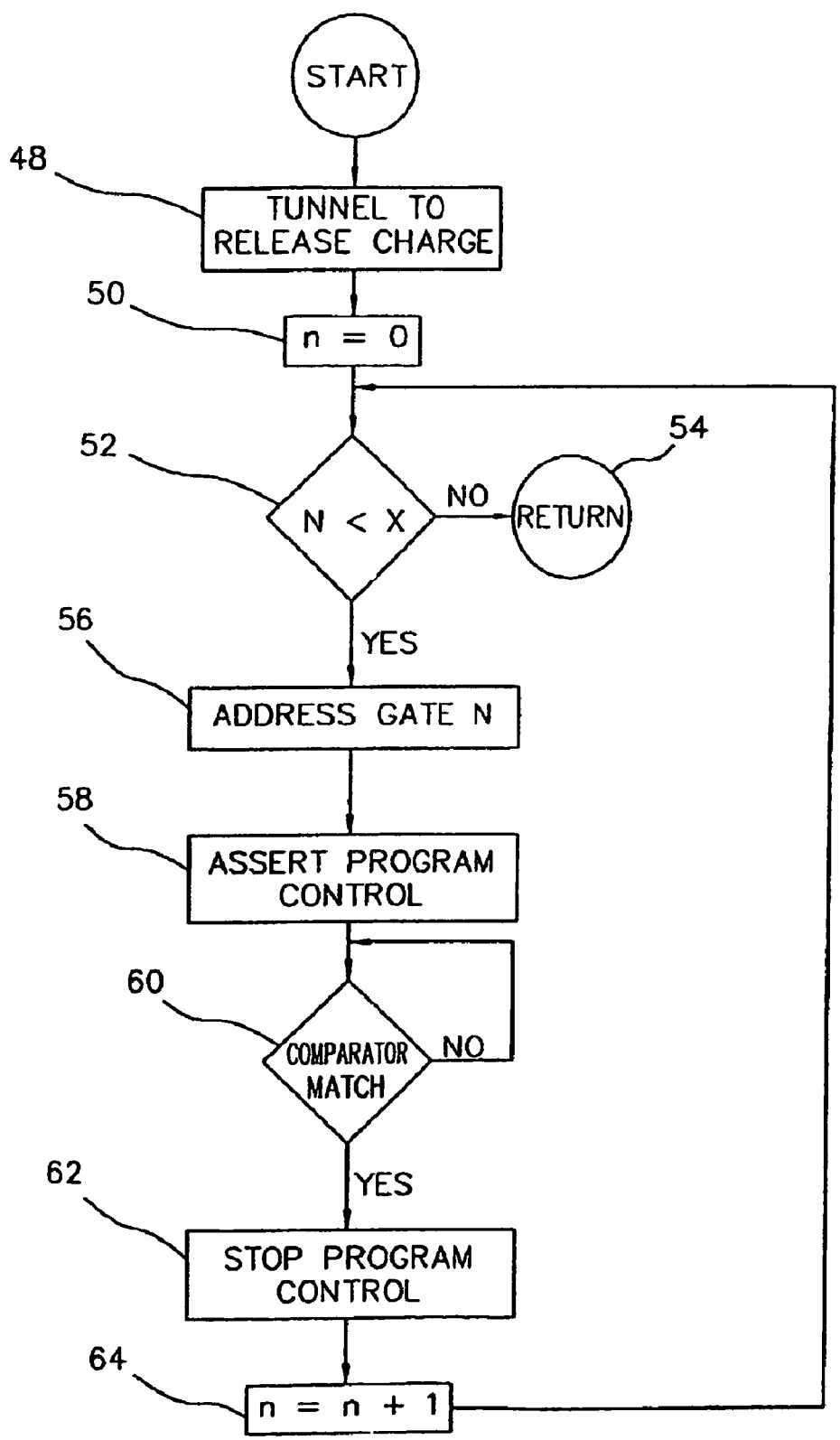
FIG. 2 is a flow chart of the floating gate programming process.

Referring to FIG. 2, the programming process begins with tunneling to release some of the electron charges from each device 48, before injecting charges to raise the current output. Next, a counter, n is set to zero 50. While the counter, n is less than the maximum number of floating gate devices, x 52, the internal digital system 20 addresses the first device 56 and signals the floating gate programming controller 24 to begin the programming process 58. The floating gate programming controller 24 provides a write signal to the addressed floating gate device. When the current from the first floating gate device reaches a desired level, the output from the internal digital system 20 matches the output from the ADC 18, and the comparator 22 signals 60 the floating gate programming controller 24 to end that programming cycle 62. This process is then repeated for each floating gate device by increasing the counter, n 64 and returning to step 52. The process returns when n reaches to total number of gates 54. Next the internal digital system 20 will program the next array of gates, if any are left to be programmed.

The total current provided to the driver 12, is the sum of the outputs of the addressed floating gate devices. Hence, 8 floating gate devices can provide 256 different current levels to the driver 12. Once programming is complete stimulation can begin by addressing any combination of floating gate devices.

All of the devices shown can be implanted within a living body and coupled to an external transmitter by inductive coupling, radio frequency, optical or other signaling means.

The external transmitter can provide floating gate addresses, and thereby, current levels for each electrode.

The above detailed description is provided to illustrate the specific embodiments of the present invention and is not intended to be limiting. Numerous variations and modifications are possible within the scope of the present invention.

We claim:

1. An electrical circuit comprising:
   a programming device for programming one or more floating gate devices by way of a programming signal;
   a comparator for comparing the programming signal with an output signal of the one or more floating gate devices and interrupting programming of the one or more floating gate devices in accordance with a value of the output signal.

2. The electrical circuit of claim 1, the circuit being for an electrical stimulator for implanting in the human body.

3. The electrical circuit of claim 2, further comprising an output device coupling total current output from the one or more floating gate devices to a stimulator electrode.

4. A method for programming one or more floating gate devices, comprising:
   providing a programming signal to the one or more floating gate devices;
   comparing the programming signal with an output signal from the one or more floating gate devices; and
   interrupting programming of the one or more floating gate devices in accordance with a value of the output signal.

5. The method of claim 4, the method being for electrical stimulation of the human body.

6. The method of claim 5, further comprising coupling total current output from the one or more floating gate devices to a stimulator electrode.

* * * * *